United States Patent

Ramm

[11] Patent Number: 5,851,894
[45] Date of Patent: Dec. 22, 1998

[54] METHOD OF VERTICALLY INTEGRATING MICROELECTRONIC SYSTEMS

[75] Inventor: Peter Ramm, Obermuehlenweg, Germany

[73] Assignee: Fraunhofer-Gesellschaft zur Foerderung der angewandten Forschung e.V., Munich, Germany

[21] Appl. No.: 642,047

[22] Filed: May 3, 1996

[30] Foreign Application Priority Data

May 5, 1995 [DE] Germany ............... 195 16 487.3

[51] Int. Cl.⁶ .................. H01L 21/283; H01L 21/304
[52] U.S. Cl. .................. 438/311; 438/459; 438/690; 438/691; 438/692; 438/693; 438/759; 438/940; 438/975; 438/977
[58] Field of Search ............... 438/311, 459, 438/690, 691, 692, 693, 759, 940, 975, 977, 385, 435, 485, 495

[56] References Cited

U.S. PATENT DOCUMENTS

| | | |
|---|---|---|
| 4,612,083 | 9/1986 | Yasumoto et al. ........ 156/633 |
| 4,784,970 | 11/1988 | Solomon . |
| 4,902,637 | 2/1990 | Kondou et al. ........... 437/51 |
| 5,185,292 | 2/1993 | VanVonno et al. . |
| 5,317,125 | 5/1994 | Hughes et al. . |
| 5,434,094 | 7/1995 | Kobiki et al. . |
| 5,627,106 | 5/1997 | Hsu . |
| 5,665,607 | 9/1997 | Kawama et al. . |

FOREIGN PATENT DOCUMENTS 63-213943  9/1988  Japan .

OTHER PUBLICATIONS

Hayashi, Y., et al., Proc. 8th Int. Workshop on Future Electron Devices, (1990), p. 85 no Month.
Akaska, Y., Proc. IEEE 74 (1986), 1703 no Month.

Primary Examiner—David Graybill
Attorney, Agent, or Firm—Karl Hormann

[57] ABSTRACT

A method of fabricating vertically integrated microelectronic systems by CMOS-compatible standard semiconductor process technology, by independently processing individual component layers of at least two separate substrates, including the formation of via holes penetrating through all existing component layers and connecting together the front surfaces of the two substrates, thinning the reverse surface of one of the substrates down to the via holes, increasing the depth of the via holes to a metallization plane of the other substrate and forming electrically conductive connections between the two substrates through the via holes.

20 Claims, 4 Drawing Sheets

METHOD OF VERTICALLY INTEGRATING MICROELECTRONIC SYSTEMS

BACKGROUND OF THE INVENTION

1. Field of the Invention

The invention, in general, relates to a method of vertically integrating microelectronic systems and, more particularly, to a method of providing vertical connections between three-dimensionally integrated circuits comprising a plurality of superposed circuit structure layers, metallization planes and substrates.

2. The Prior Art

The advantages of a three-dimensionally integrated microelectronic circuit are manifold, but among those most prominent are higher packaging densities at comparable design rules, as well as higher switching rates, relative to two-dimensional systems (planar technology). The higher switching rates are the result, on the one hand, of shorter connecting paths between individual components or circuits and, on the other hand, of the capability of parallel data processing. By providing a connecting technique incorporating locally selectable superintegrated vertical contacts, the efficiency of the system may be optimally improved.

The following methods are currently known for manufacturing three-dimensionally integrated circuits provided with freely selectable vertical contacts:

Y. Akasaka is proposing (Proc. IEEE 74 (1986), 1703) to precipitate, and re-crystallize, poly-crystalline silicon on a finished structural component layer so that further structural components may be manufactured in the re-crystallized layer. The disadvantages of such a method are the yield-reducing degradation of the structural components in the lower plane as a result of the high thermal stresses during re-crystallization as well as the necessarily serial or consecutive processing of the overall system. On the one hand, the latter unavoidably leads to long processing times during the manufacture and, on the other hand, to reduced yields owing to the compounding of process related rejects. Together, they result in significantly increased production costs relative to the separate processing of individual planes in separate substrates.

From Y. Hayashi et al. (Proc. 8th Int. Workshop on Future Electron Devices, 1990, p. 85) it is known initially to manufacture individual structural components separately from each other. Subsequently, the substrates are thinned down to a few micrometers, provided with contacts at their front and reverse surfaces, and vertically connected by a bonding process. However, to provide such front and reverse surface contacts requires extraordinary processes not called for in ordinary semiconductor manufacturing (CMOS), including treatment of MOS incompatible materials, e.g., gold, and the structuring of the reverse surface.

When connecting two finished structural component substrates, it is necessary precisely to align the two substrates by means of alignment indicia before they are joined. Where structuring of the reverse surface is to be avoided, the alignment indicia have hitherto been applied to the front surfaces of the substrates, and the alignment has taken place by infrared transmission or fluoroscopy (known, for instance, from the so-called flip-chip bonding). The array of the layers of the upper substrate at the time at which the connection is performed precludes any optical transmission alignment of the structural component planes in the visual spectrum.

The application of the infrared transmission process calls for specialized apparatus, such as, in particular, a bonding apparatus equipped for infrared transmission alignment. Such apparatus are uncommon in the semiconductor fabrication. Moreover, the substrates to be connected must all have polished surfaces (handling substrate and lower structural component substrate), since the infrared radiation would otherwise be diffusely dispersed at the interfaces, and there would be no image of the alignment indicia. Even with polished surfaces, the precision of such an alignment is less by a factor of two than an alignment in the visual spectrum, because of the longer wavelength of infrared radiation as compared to visual light. Thus, the package density of the vertical connection is only 25% of the value attainable with visual light. Moreover, the complex layer structure of an integrated circuit comprising a plurality of interfaces, and the inherent reflections lead to a further reduction of the alignment precision of the transmission or fluoroscopic process. Furthermore, the process limits the freedom of design and the choice of substrates since good radiation transmission is necessary in the area of the alignment indicia.

Japanese Patent Specification JP 63-213,943 discloses a method of vertically integrating microelectronic systems in which the processing of two structural component planes takes place in separate substrates (top and bottom substrate). According to this method, the top substrate is first provided with via holes penetrating all the layers of his substrate containing circuit structures. The front surface of the substrate is then connected to an auxiliary substrate, and its reverse surface is thinned down and applied to the front surface of the bottom substrate. The auxiliary substrate is removed and the existing via holes are opened down to the metallization of the bottom substrate. The via holes are filled and contact to the metallization level or plane of the top substrate is established by contact holes. However, the thinning of the top substrate prior to bonding requires a special handling technique for the top substrate. This handling technique includes the application and subsequent removal of an auxiliary substrate (handling substrate). The additional manufacturing steps increase production costs. The removal of the auxiliary substrate after thinning of the top substrate also reduces the yield of components because structural component layers may become damaged during the operation.

A further aspect of the method is that following the connection of the substrate to a stack of structural elements, it is necessary to structure the connecting metallization produced by precipitating a metallic substance onto the surface of the upper component plane. The lithographic steps required for this process have the following disadvantages: High demands as regards the photoresist and exposure technique as a result of the non-standard substrate material (stack of thinned and bonded substrates), as well as reduced yields in the metal structuring lithography because of the existing pronounced topography after execution of the via hole technique as a result of non-uniform photoresist thicknesses and problems with the wetting of the photoresist, including the tearing-off of photoresist.

Thus, the particular disadvantages of the known processes are long processing times of the substrates during their manufacture, high production costs, reduced production yields or the necessary performance of special processes which are incompatible with standard semiconductor manufacturing technologies.

THE OBJECTS OF THE INVENTION

It is accordingly an object of the invention to provide a novel method of manufacturing vertically integrated semiconductors which does not suffer from the disadvantages of methods hitherto practiced.

Another, more specific object of the invention resides in the provision of a method of manufacturing three dimensionally integrated semiconductors by CMOS-compatible processes of standard semiconductor manufacturing techniques.

A still further object of the invention is a manufacturing method of the kind referred to which provides high production yields.

Other objects will in part be obvious and will in part appear hereinafter.

BRIEF SUMMARY OF THE INVENTION

In the accomplishment of these and other objects the invention provides a novel method of vertically integrating microelectronic systems by providing a first substrate containing in the area of a first major surface at least one layer including circuit structures and at least a first plane comprising metallization, opening via holes penetrating all circuit structure layers, providing a second substrate containing in an area of a second major surface at least a second layer including circuit structures and at least a second plane comprising metallization, connecting the first and second substrates by joining in predetermined alignment the first major surface of the first substrate to the second major surface of the second substrate, thereby forming a stack of substrates, thinning the stack of substrates at the surface of the first substrate to open the via holes, increasing the depth of the via holes to the metallization of the second plane of the second substrate, and providing an electrically conductive connection through the via holes between the metallization of the first plane and the metallization of the second plane.

Other aspects and advantages of the method in accordance with the invention will become apparent in the following description.

BRIEF DESCRIPTION OF THE SEVERAL DRAWINGS

The novel features which are characteristic of the invention are set forth with particularity in the appended claims. The invention itself, however, in respect of its structure, construction, and lay-out, as well as manufacturning techniques, together with other objects and advantages thereof will best be understood from the ensuing description of the preferred embodiment, when read in conjunction with the drawings, in which:

FIG. 1 is an exemplary rendition of top and bottom substrates following sequentially performed operational steps of the method in accordance with the invention, wherein

Figure 1A:
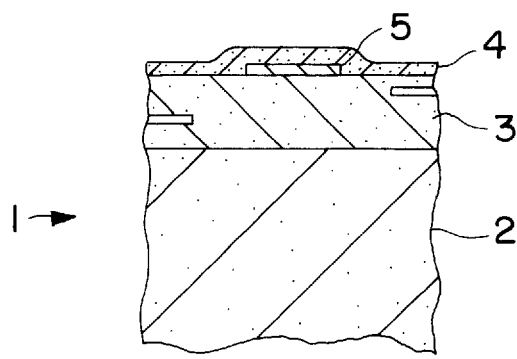
FIG. 1a is a top substrate including a structural component plane, three-layered metallization and passivated surface.
Figure 1B:
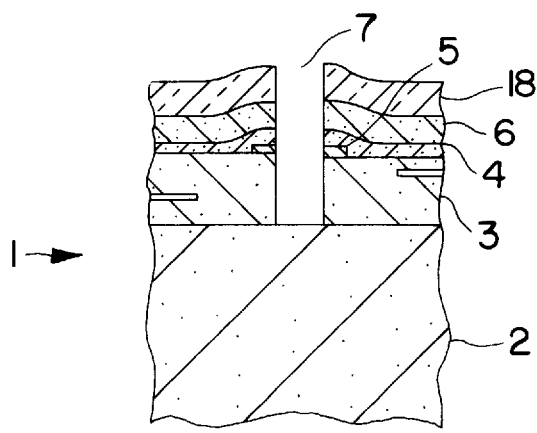
FIG. 1b shows the top substrate following plasma oxide deposition, application of a photoresist mask.
Figure 1C:
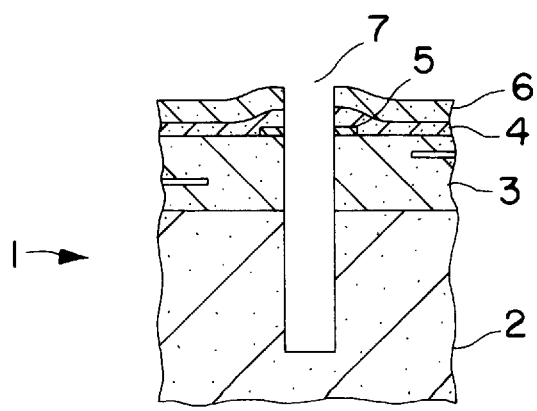
Figure 1D:
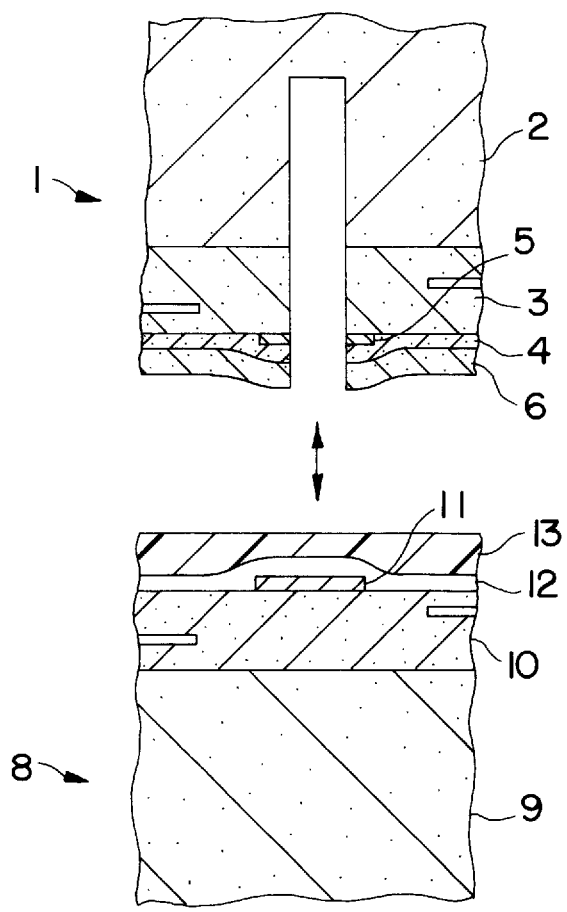
Figure 1E:
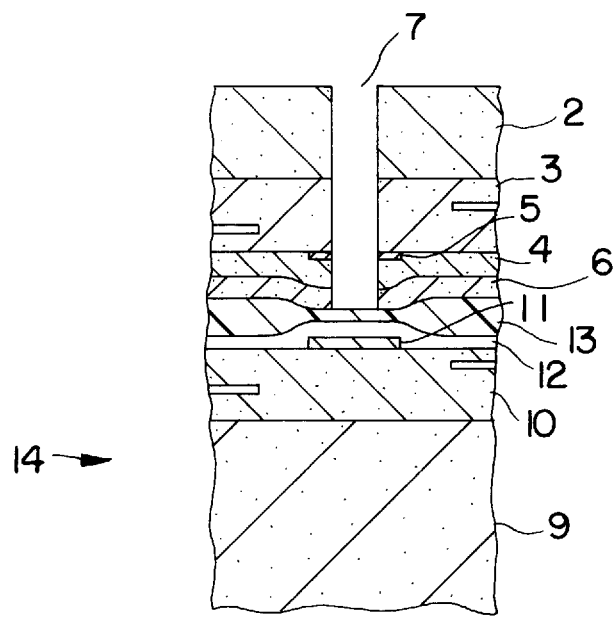
Figure 1F:
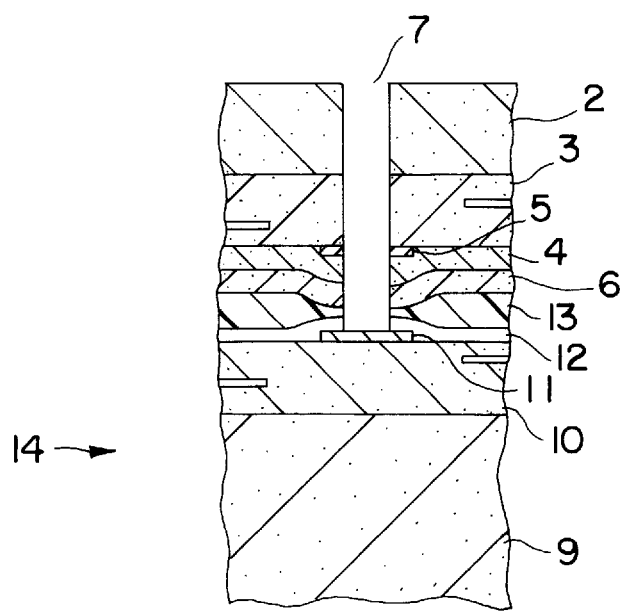
Figure 1G:
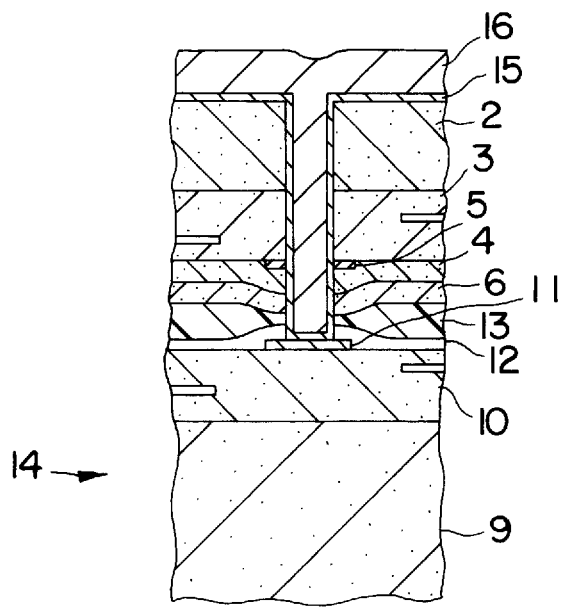
Figure 1H:
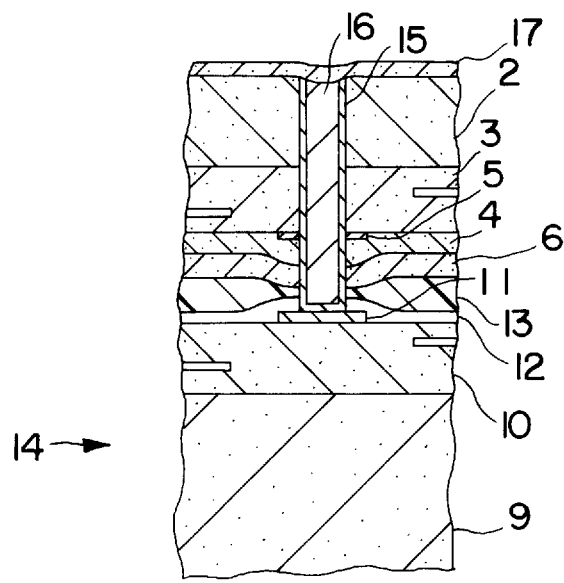

fototechnique for the via holes, and anisotropic etching of the via holes;

FIG. 1c shows the top substrate following removal of the photoresist;

mole etching of the via holes to the silicon;

FIG. 1d shows the connecting of top and bottom substrate following passivating the surface of the bottom substrate and application of a bonding layer on the bottom substrate;

FIG. 1e shows the top and bottom substrates (the substrate stack) following an aligned connection (bonding) and thinning of the surface of the top substrate to the via holes;

FIG. 1f shows the substrate stack following the deepening of the via holes to a metallization of the bottom substrate;

FIG. 1g shows the substrate stack following precipitation of a barrier and adhesion layer and subsequent precipitation of a metallic substance;

FIG. 1h shows the substrate stack following grinding of the stack surface and application of a protective layer.

DETAILED DESCRIPTION OF THE PREFERRED EMBODIMENTS

The embodiment shown in FIG. 1a provides for a top substrate 1 comprising a bulk wafer of silicon 2 including, in a chip plane 3, finished, i.e. completely processed, MOS circuits and a treble layered metallization, passivated with an oxide/nitride protective layer 4. The metallization 5 of the uppermost metallization plane may be an aluminum alloy. Below the metallization plane, there are provided undoped as well as doped oxide layers. As a mask for subsequently to be performed dry-etching, a layer 6 of, for instance, plasma oxide serving as a hard mask is precipitated first, and a photo process is performed for the via holes 7. The plasma oxide 6, the oxide/nitride protective layer 4, the metallization 5 as well as the oxide layers in the chip plane 3 below them are anisotropically etched with the aid of a photoresist mask 18. The result is depicted in FIG. 1b. After removal of the photoresist the silicon 2 is trench etched to a depth of about 10 $\mu$m (see FIG. 1c). Using an SOI (silicon on insulator) material as the top substrate 1, etching is carried out down to the surface of the buried oxide, using $SiO_2$ as an etching stop or limit.

A layer 13 of polyimide is spin-coated as an inter chip adhesive onto the bottom wafer 8 (9=silicon) provided with finished MOS circuits in the chip plane 10 of the bottom, treble layered metallization (metallization=11) und passivation 12, so that the surface topography is rendered planar. Thereafter, the top substrate 1 and the bottom substrate 8, with the polyimide layer 13 on the plasma oxide 6, are bonded together in a wafer bonding apparatus and aligned by split optic alignment, as commonly practiced by flip chip bonding processes (see FIG. 1d).

After the optically aligned bonding of the top substrate 1 and the bottom substrate 8, the resultant substrate stack 14 is thinned by a mechanical, wet chemical; and chemomechanical process; until the via holes 7 are opened (see FIG. 1e). Using an SOI material rather than bulk silicon 2 etching is initially carried out down to the surface of the buried oxide, $SiO_2$ serving as the etching stop, and thereafter the oxide layer is removed, Silicon being used as the etching stop. Following its thinning, the substrate stack 14 may be processed like a standard wafer. The polyimide layer 13 and the protective passivation layer 12 over the metal 11 of the bottom metallization are etched within the via holes using the silicon 2 as a hard mask. In this case, the metallization 11 acts as an etching stop. The result is shown in FIG. 1f.

For electrically connecting the top metallization 5 and the bottom metallization 11 a titanium nitride layer 15 is first precipitated as a bonding and barrier layer for a subsequently applied tungsten metallization 16 (by W deposition).

By chemomechanical grinding with a C.M.P. apparatus, the tungsten/titanium nitride layers 15, 16 are removed from the surface of the silicon 2 so that the remaining tungsten/titanium nitride plugs establish the vertical connection between top and bottom components. Finally, an oxide/nitride protective layer 17 is precipitated for the passivation of the component stack (see FIG. 1h).

It will thus be seen that according to the method of the invention individual component layers in different substrates are processed independently of each other and are subsequently bonded together. Initially, the finished substrate, i.e. the first substrate, hereinafter sometimes referred to as top substrate, including one or more component layers und metallization levels, is provided at its front surface with via holes. It will be appreciated that the top substrate is the one the component layers of which, in a finished integrated circuit structure are to be located above the component layers of a further substrate, the further or second substrate being hereinafter sometimes referred to as bottom substrate.

Preferably, a masking layer either functioning as a planarizer or being planarized, may be utilized for this purpose. The via holes are opened at that position, for instance by etching, where a vertical contact is subsequently to be established between the metallization levels of the top substrate and of the bottom substrate; they penetrate through all component layers and metallization levels in the top substrate. The via holes which preferably open in the direction of the metallization levels to be contacted, preferably stop several micrometers below the component layer of the top substrate and, if a SOI substrate is utilized, they will end at the buried oxide layer.

Thereafter, a further completely finished substrate, i.e. the bottom substrate, including one or more component layers and metallization levels, is connected to the top substrate. For this purpose, the front surface of the bottom substrate, i.e. the surface of the upper component layer of the bottom substrate, is provided with a transparent bonding layer ie transparent or transmissive to the electromagnetic radiation employed in the split optics method of aligning the top and bottom substrates. The bonding layer may at the same time provide passivation and/or planarization. Alternatively, no bonding layer may be necessary, and a planarizing or planarized layer may be made and following a suitable surface treatment a direct bond may be established, by a direct bonding process, with the surface of the upper-most component layer of the top substrate. Top and bottom substrates are thereafter aligned relative to each other and the front surface of the top substrate is connected to the top surface of the bottom substrate. Alignment may be provided in the visual spectrum by split optics using alignment indicia. The alignment indicia may be contained in the uppermost metallization level of the top and bottom substrates, or they may be placed in the top substrate in a manner similar to the via holes, i.e. preferably by etching of alignment structures from the front surface of the top substrate.

Following its bonding to the bottom substrate, the top substrate is thinned from its reverse surface dawn to the via holes. Thinning may be accomplished, for instance, by wet or dry chemical etching and/or by mechanical and/or chemomechanical grinding. Where the top substrate consists of a SOI substrate the SOI silicon may act as an etching stop.

The depth of the now open via holes, will now be increased through the remaining layers, such as, for example, the bonding layer and the passivation layer of the bottom substrate down to the metallization layer of the metallization plane of the bottom substrate. This may be performed without a lithographic process since the top substrate structured with the via holes may be used as a mask, i.e. a hard mask.

Finally, electrical contact between the metallization of a metallization level of the top substrate and the metallization of a metallization level of the bottom substrate is established through these via holes.

To this end, a metallic substance is precipitated on the substrate stack such that it covers the via holes through the metallization of the top substrate down to the metallization of the bottom substrate. It is thereafter removed from the surface of the substrate by means of an anisotropic etching process or a chemomechanical grinding process, so that metallic material remains only within the via holes. The vertical integration of the component layers of top and bottom substrates is established by these metallic plugs. By an application of a dielectric layer the front surface of the component stack may be passivated as a final step.

This embodiment permits practicing the method in accordance with the invention without requiring lithographic processes on the joined substrate stack. In this manner the method is simplified and, in addition, its yield is increased.

Vertical integration with another component plane may be accomplished in accordance with the described method by treating the existing stack of substrates in the same manner as a bottom substrate with the metallic plugs functioning as the bottom metallization. For this purpose the vertical connection between two or more component planes is defined by the design of the respective metallization levels.

Because of the processing of individual component layers separate from each other in separate substrates (parallel processing) the method according to the invention leads to significantly reduced processing times in the manufacture of vertical circuit structures and, therefore, to reduced production costs.

Preferably, only CMOS compatible technologies or processes are utilized in practicing the method in accordance with the invention, since, special structuring of reverse sides of substrates is no longer necessary.

The formation of the via holes in individual substrates, before they are joined i.e. on the wafer level, makes it possible to integrate this process step into the processing of the individual substrate (parallel processing). Not to have to use auxiliary substrates and the avoidance of any lithographic steps on composite or joined component stacks advantageously results in a reduction of processing times and to an increase in productivity.

A further advantage resides in the fact that a split optic in the visual spectrum may be used for the alignment of individual component layers in superposition. Thus, in contrast to transmission processes neither the array of the layers beneath the alignment insignia of the top substrate nor the array of layers beneath the alignment indicia of the bottom substrate need be transparent. Thus, a higher accuracy in alignment and, hence, a higher packaging density may be attained than with an infrared transmission process. The alignment indicia may be applied during processing of individual substrates in the respective uppermost component layer of each substrate and does not require additional techniques or processes.

What is claimed is:

1. A method of vertically integrating microelectronic systems, comprising the steps of:

providing a first substrate comprising a first side which in an area of a first major surface comprises at least one first layer containing circuit structures and at least one first metallized metallization level;

opening in the area of said first major surface a plurality of via holes of a depth sufficient for penetrating said at least one first circuit structure containing layer;

providing a second substrate comprising a side which in an area of a second major surface comprises at least one second layer containing circuit structures and at least one second metallized metallization level;

connecting said first substrate to said second substrate by putting together said side of said first major surface and said side of said second major surface in aligned relationship, thereby to provide a stack of substrates;

thinning the stack of substrates at a side of said first substrate opposite said first side for opening said via holes therein;

increasing said depth of said via holes down to the metallization of said metallization level of said second substrate; and providing means extending through said via holes for forming an electrically conductive connection between said metallization of said first and said metallization of said second metallization level.

2. The method of claim 1, wherein said opening of said via holes includes the penetration thereof through said metallization in said first substrate.

3. The method of claim 1, wherein said first and second substrates are connected in an aligned manner by alignment indicia provided in said area of said first major surface of said first substrate and said area of said second major surface of said second substrate.

4. The method of claim 1, wherein said via holes are opened by an etching process.

5. The method of claim 4, wherein said etching process includes anisotropic etching through said at least one first layer containing circuit structures and subsequent trench etching to substantially 10 μm below said at least one first layer.

6. The method of claim 5, wherein a buried oxide layer is provided as an etching stop.

7. The method of claim 1, wherein said thinning is performed by etching.

8. The method of claim 6, wherein said thinning is performed by grinding.

9. The method of claim 1, wherein said first substrate comprises an SOI substrate and wherein thinning is performed down to an oxide layer buried in said SOI substrate followed by removal of said oxide layer with the substrate material acting as an etching stop.

10. The method of claim 1, wherein said first and second substrates are connected to each other by a bonding layer applied to said second major surface of said second substrate.

11. The method of claim 10, wherein said bonding layer is a passivation layer.

12. The method of claim 10, wherein said bonding layer provides a planarizing layer.

13. The method of claim 1, wherein said step of connecting said first and second substrates comprises treatment of at least one of said first and second major surfaces to provide a direct bond with the other of said first and second major surfaces.

14. The method of claim 1, wherein said connecting step is preceded by forming a substantially planar express surface.

15. The method of claim 1, wherein said connecting step is preceded by forming a planarized layer.

16. The method of claim 1, wherein the step of increasing the depth of said via holes is performed by anisotropic etching and wherein the material of said first substrate is utilized as a etching mask.

17. The method of claim 1, wherein said step of providing said means for forming said electrically conductive connection comprises the following steps:

precipitating within said via holes a bonding and barrier layer;

precipitating in said via holes a metallic substance;

chemomechanically grinding off from said surface of said stack of substrates said bonding and barrier layer and said metallic substance.

18. The method of claim 10, wherein said first and second substrates are connected by the step of applying a layer of polyimide to said second substrate.

19. The method of claim 1, wherein said step of providing means for forming an electrically conductive connection comprises precipitating a metal to cover the via holes from the top surface of the first substrate to the metallization of the bottom substrate.

20. The method of claim 19, wherein said metal is initially precipitated as a layer of titanium nitride followed by a tungsten metallization of predetermined shape.

* * * * *